(12) United States Patent
Hsu et al.

(10) Patent No.: US 10,224,380 B2
(45) Date of Patent: *Mar. 5, 2019

(54) DISPLAY DEVICE

(71) Applicant: InnoLux Corporation, Miao-Li County (TW)

(72) Inventors: Yi-Hua Hsu, Miao-Li County (TW); Ming-Chun Tseng, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/911,355

(22) Filed: Mar. 5, 2018

(65) Prior Publication Data

US 2018/0190733 A1 Jul. 5, 2018

Related U.S. Application Data

(63) Continuation of application No. 15/451,441, filed on Mar. 7, 2017, now Pat. No. 9,941,334.

(30) Foreign Application Priority Data

Mar. 22, 2016 (TW) .............................. 105108781 A

(51) Int. Cl.
*H01L 27/32* (2006.01)
*G09G 3/3233* (2016.01)
(Continued)

(52) U.S. Cl.
CPC ....... *H01L 27/3218* (2013.01); *G09G 3/3233* (2013.01); *G09G 5/02* (2013.01);
(Continued)

(58) Field of Classification Search
CPC .. G09G 5/02; G09G 5/04; G09G 3/00; G09G 3/2003; G09G 3/2074; G09G 3/3208;
(Continued)

(56) References Cited

U.S. PATENT DOCUMENTS 8,552,633 B2 10/2013 Hong
8,598,784 B2 12/2013 Ko
(Continued)

FOREIGN PATENT DOCUMENTS

CN 103366683 A 10/2013
CN 106887208 A 6/2017

*Primary Examiner* — Eduardo A Rodela
(74) *Attorney, Agent, or Firm* — Bacon & Thomas, PLLC

(57) ABSTRACT

A display device includes: a pixel group, including first and second sub-pixels, third and fourth sub-pixels, and fifth, sixth and seventh sub-pixels, wherein the first sub-pixel is diagonal to the second sub-pixel, the fifth sub-pixel is between the first and second sub-pixels, the third sub-pixel is diagonal to the fourth sub-pixel, and the fifth sub-pixel is between the third and fourth sub-pixels, wherein the scan line is electrically connected to thin film transistors of the first, fifth, third and sixth sub-pixels, wherein the first data line is electrically connected to thin film transistors of the first and fourth sub-pixels, and the second data line is electrically connected to thin film transistors of the fifth and seventh sub-pixels, wherein the first and second sub-pixel have the same color, the third and fourth sub-pixel have the same color, and the fifth, sixth and seventh sub-pixel have the same color.

20 Claims, 5 Drawing Sheets

(51) Int. Cl.
*G09G 5/02* (2006.01)
*H01L 51/00* (2006.01)

(52) U.S. Cl.
CPC ...... *H01L 27/3213* (2013.01); *H01L 27/3216* (2013.01); *H01L 51/0011* (2013.01); *H01L 27/3276* (2013.01)

(58) Field of Classification Search
CPC .. G09G 3/3225; G09G 3/3233; G09G 3/3258; H01L 27/32; H01L 27/3202; H01L 27/3204; H01L 27/3206; H01L 27/3211; H01L 27/3213; H01L 27/3216; H01L 27/3241; H01L 27/3248; H01L 27/326; H01L 51/50; H01L 51/5036
See application file for complete search history.

(56) References Cited

U.S. PATENT DOCUMENTS

| | | |
|---|---|---|
| 8,716,929 B2 | 5/2014 | Yoo et al. |
| 9,685,137 B2 | 6/2017 | Nakanishi et al. |
| 9,941,334 B2 * | 4/2018 | Hsu .................. H01L 27/3218 |
| 2003/0128179 A1 | 7/2003 | Credelle |
| 2008/0001525 A1 | 1/2008 | Chao et al. |
| 2013/0234917 A1 | 9/2013 | Lee |
| 2014/0071175 A1 | 3/2014 | Yang et al. |
| 2016/0117969 A1 | 4/2016 | Qin et al. |
| 2017/0140706 A1 * | 5/2017 | Song .................. G09G 3/3233 |
| 2017/0169748 A1 | 6/2017 | Chen |
| 2017/0278905 A1 | 9/2017 | Hsu et al. |

\* cited by examiner

DISPLAY DEVICE

CROSS REFERENCE TO RELATED APPLICATION

This application claims the benefits of the Taiwan Patent Application Serial Number 105108781, filed on Mar. 22, 2016, the subject matter of which is incorporated herein by reference.

This application is a continuation (CA) of U.S. Patent application for "DISPLAY DEVICE", U.S. application Ser. No. 15/451,441 filed Mar. 7, 2017, and the subject matter of which is incorporated herein by reference.

BACKGROUND

1. Field of the Disclosure

The present disclosure relates to display devices, and more particularly to an organic light-emitting diode display device wherein red, green and blue sub-pixels are arranged in a novel manner.

2. Description of Related Art

With the development of technology related to display panels, the requirements for image fineness of display panels are more and more demanding, and this drives almost all dealers to advance their existing display panels. Particularly, the growth of 4K2K panels and hand-held display devices with high PPI (pixels per inch) resolution, such as mobile phones, tablets, etc., further confirms the trend in the panel industry toward even higher resolution, which means more pixels have to be packed into a unit area.

Organic light-emitting diode display devices have been popular in various electronic devices having a display screen, such as displays, mobile phones, laptops, video cameras, still cameras, music players, mobile navigators, TV sets and so on.

For making an organic light-emitting diode display device capable of emitting red light, green light and blue light, organic materials associated with different light colors are deposited on a substrate through evaporation. In such an evaporation process, a metal mask is used to comprise sub-pixels of different colors, and a fine metal mask (FMM) is particularly critical to evaporation for making display devices of high PPI resolution. However, manufacturing of a fine metal mask can be costly, and is a factor having key impact on the overall manufacturing costs of organic light-emitting diode display devices.

Apart from the above, in an organic light-emitting diode display device capable of emitting red light, green light and blue light, the organic material responsible for blue light has relatively low luminous efficiency and short service life, and this degrades the overall display quality of the organic light-emitting diode display device.

In view of this, there is a need for a novel organic light-emitting diode display device that requires less manufacturing costs and provides better display quality as desired by consumers.

SUMMARY

A primary objective of the present disclosure is to provide a display device that supports high-resolution display with novel arrangement of its red, green and blue sub-pixels.

Another objective of the present disclosure is to provide a display device that is made through a method using one fewer mask evaporation step than the conventional method, thereby saving the costs for making a display device.

The present disclosure provide a display device comprising: a pixel group comprising a first pixel comprising a red sub-pixel and a blue sub-pixel; a second pixel comprising a green sub-pixel and a blue sub-pixel; a third pixel comprising a green sub-pixel and a blue sub-pixel; and a fourth pixel, essentially comprising a red sub-pixel and a blue sub-pixel; wherein the first pixel and the second pixel are adjacent to each other and arranged in a row direction, and the first pixel and the third pixel are adjacent to each other and arranged in a column direction, wherein the fourth pixel is diagonal to the first pixel, and the fourth pixel is adjacent to the second pixel and the third pixel, wherein the blue sub-pixels are quantitatively more than the red sub-pixels, and the blue sub-pixels are quantitatively more than the green sub-pixels.

Therein, the disclosed display device further comprises: a substrate; plural first electrodes, plural second electrodes, and plural third electrodes, all disposed on the substrate; a red organic material layer disposed on the first electrodes; a green organic material layer disposed on the second electrodes; a blue organic material layer disposed on the third electrodes, the red organic material layer and the green organic material layer, and a fourth electrode disposed on the blue organic material layer; wherein the first electrodes are corresponding to the red sub-pixels, the second electrodes are corresponding to the green sub-pixels, and the third electrodes are corresponding to the blue sub-pixels, in which from a top-view perspective the fourth electrode overlaps the first electrodes, the second electrodes and the third electrodes, while the blue organic material layer overlaps the red organic material layer and the green organic material layer.

In the disclosed display device, the first pixel and the fourth pixel both have red and blue sub-pixels, while the second pixel and third pixel both have green and blue sub-pixels. With the novel arrangement of the sub-pixels, the disclosed display device supports high-resolution display. In addition, since all of the first, second, third and fourth pixels comprise blue sub-pixels, the blue sub-pixels take the largest percentage among the total sub-pixels in the display device, and this compensates the inferior luminous efficiency of blue sub-pixels in an organic light-emitting diode.

Moreover, in the disclosed display device, the red organic material layer is disposed on the first electrode, the green organic material layer is disposed on the second electrode, and the blue organic material layer is disposed on the red organic material layer, the green organic material layer and the third electrode. Thus, only the formation of the red and green organic material layers requires evaporation with metal masks of different patterns, and the blue organic material layer can be made through evaporation without using another fine metal mask. In other words, the disclosed display device is made through a method using one fewer mask evaporation step than the conventional method, thereby saving the costs for making a display device.

Other objects, advantages, and novel features of the disclosure will become more apparent from the following detailed description when taken in conjunction with the accompanying drawings.

DETAILED DESCRIPTION OF EMBODIMENT

The following embodiments with the accompanying drawings are made to clearly exhibit the above-mentioned and other technical contents, features and effects of the present disclosure. Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended only to describe the elements claimed and imply or represent neither that the claimed elements have any preceding ordinals, nor that sequence between one claimed element and another claimed element or between steps of a manufacturing method. The use of these ordinals is merely to differentiate one claimed element having a certain designation from another claimed element having the same designation.

In the present disclosure, the term "the pixel A is diagonal to the pixel B" refers to a condition that a connection line between the pixel A and the pixel B is not equal to a direction of R or C; wherein, an angle included between the aforesaid connection line and the direction of R or C is not limited to 45 degree, as long as an angle is included between the aforesaid connection line and the direction of R or C. The above mentioned pixel A and pixel B can respectively be any pixel in the present disclosure.

Figure 1:
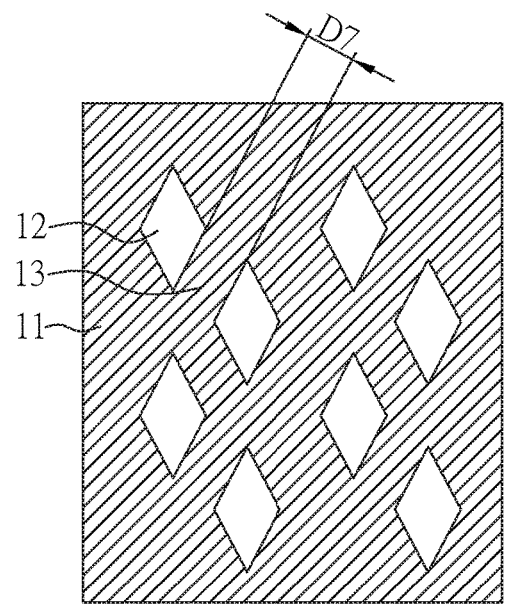
FIG. 1 is a schematic drawing of a metal mask used in one embodiment of the present disclosure.
Figure 2:
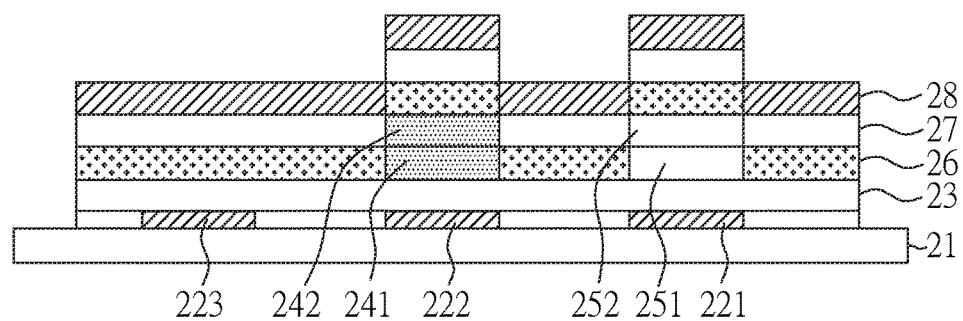
FIG. 2 is a schematic cross-sectional drawing of an organic light-emitting diode display device of one embodiment of the present disclosure.

FIG. 1 is a schematic drawing of a metal mask used in one embodiment of the present disclosure. FIG. 2 is a schematic cross-sectional drawing of an organic light-emitting diode display device of one embodiment of the present disclosure. According to one embodiment of the present disclosure, an organic light-emitting diode display device is made through a method described below.

Referring to FIG. 2, first, a substrate 21 is provided, and thin film transistor units and associated driving circuits (not shown) are disposed on the substrate 21. The substrate 21 may be made of glass, plastic, resin, sapphire, metal foil, or a flexible material. Then a first electrode 221, a second electrode 222 and a third electrode 223 are disposed on the substrate 21 independently as anodes. The first electrode 221, the second electrode 222 and the third electrode 223 are electrically connecting to the corresponding thin film transistor elements and associated driving circuits, so as to control input of signals. Herein, the first electrode 221, the second electrode 222 and the third electrode 223 may be each a transparent or a reflective electrode of a single-layer or multi-layer structure. Therein, the transparent electrode may be a transparent metal oxide (TCO) electrode, such as an ITO electrode or an IZO electrode, and the reflective electrode may be a metal thin film electrode, such as a magnesium-silver alloy thin film electrode, a gold thin film electrode, a silver thin film electrode, a platinum thin film electrode, an aluminum thin film electrode and so on. The multi-layer structure may be referring to, for example, a combination of one silver thin film electrode sandwiched between two ITO electrodes (ITO-Ag-ITO). Afterward, a pixel defining layer (not shown) is disposed on the first electrode 221, the second electrode 222 and the third electrode 223. The pixel defining layer has plural vents (not shown) corresponding to the first electrode 221, the second electrode 222 and the third electrode 223, so as to define respective areas for the first electrode 221, second electrode 222 and the third electrode 223 to display sub-pixels. From a top-view perspective (in a normal direction of a direction parallel to a surface of the substrate, wherein plural pixels including sub-pixels are disposed on this surface of the substrate), these vents have their bottom areas smaller than the areas on the first electrode 221, the second electrode 222 and the third electrode 223. The part of each electrode exposed in at the bottom of the corresponding vent is a part can substantially control the organic light-emitting diode light-emitting layer (the rest of the pixel defining layer has thickness greater than 0, and the pixel defining layer separates the electrodes and the organic material layer), also known as an electrode control area. The electrode control area may have its shape the same as or different from that of the electrode it corresponds, and the electrode control area has its area smaller than or equal to that of the electrode and greater than 0. The electrode control area is substantially equal to the area of the bottommost part of the vent. On top of the above, a hole transport/injection layer 23 is disposed. While the hole transport/injection layer 23 shown herein is of a single-layer structure, the present disclosure is not limited thereto. The hole transport/injection layer 23 may be of a single-layer or multi-layer structure.

Then, as shown in FIG. 1 and FIG. 2, the fine metal mask 11 of FIG. 1 is used in an evaporation process to form a red organic material layer on the first electrode 221, which is connecting to a first electrode control area of the first electrode 221 through the vent of the pixel defining layer corresponding to the red sub-pixel. Therein, the red organic material layer comprises a red hole transport layer 251 and a red light-emitting layer 252. Herein, the fine metal mask 11 has plural openings 12. These openings 12 correspond to the sites of the first electrodes 221 on the substrate 21. The red hole transport layer 251 and the red light-emitting layer 252 are formed in two separated evaporation steps. The openings 12, the red hole transport layer 251 and the red light-emitting layer 252 each have an area greater than or equal to that of the first electrodes 221. The red hole transport layer 251 and the red light-emitting layer 252 each have an area greater than or equal to that of the openings 12.

Afterward, as shown in FIG. 2, the metal mask 11 of FIG. 1 is used in an evaporation process to form a green organic material layer on the second electrode 222, which is connecting to a second electrode control area of the second electrode 222 through the vent of the pixel defining layer corresponding to the green sub-pixel. Therein, the green organic material layer comprises a green hole transport layer 241 and a green light-emitting layer 242. The fine metal mask used to form the green organic material layer is structurally similar to the fine metal mask used to form the red organic material layer, except that the pattern and arrangement of the openings are designed according to the second electrode 222 on the substrate 21. The opening 12, the green hole transport layer 241 and the green light-emitting layer 242 each has an area greater than or equal to that of the second electrode 222. The green hole transport layer 241 and the green light-emitting layer 242 each has an area greater than or equal to that of the opening 12. The green organic material layer may overlap or not overlap the red organic material layer viewed from a top-view perspective.

In the present embodiment, the red/green organic material layer has a two-layer structure. Therein the red light-emitting layer 252/green light-emitting layer 242 is the layer emitting red light/green light, and the red hole transport layer 251/green hole transport layer 241 may have its brightness and color adjusted by changing its thickness or material. However, the present disclosure is not limited thereto. In other embodiments of the present disclosure, the red/green organic material layer may be of a single-layer structure that contains only one red light-emitting layer 252/green light-emitting layer 242. Alternatively, it may be of a multi-layer structure that has, in addition to the red hole transport layer 251/green hole transport layer 241 and the red light-emitting layer 252/green light-emitting layer 242, other layers that improve the red/green pixel in terms of luminous efficiency and color light.

Afterward, as shown in FIG. 2, through an evaporation process (using an open mask or using no metal masks), a blue organic material layer 26 is formed on the third electrode 223, the green light-emitting layer 242 and the red light-emitting layer 252. The blue organic material layer 26 is connecting to a third electrode control area of the third electrode 223 through the vent of the pixel defining layer corresponding to the blue sub-pixel. The blue organic material layer 26, when viewed from a top-view perspective, overlaps the third electrode 223, the green light-emitting layer 242 and the red light-emitting layer 252. The blue organic material layer 26, when viewed from a top-view perspective, has its area greater than that of the first electrode 221, the second electrode 222, the third electrode 223, the red light-emitting layer 252, the green light-emitting layer 242 and the opening 12. While the blue organic material layer 26 shown is of a single-layer structure, the present disclosure is not limited thereto. The blue organic material layer 26 may further have other layers that improve luminous efficiency and color light. Then, an electron transport layer 27 is disposed on the blue organic material layer 26. Similarly, the electron transport layer 27 of the present embodiment is not limited to a single-layer structure, and it may instead have other layers that improve luminous efficiency. At last, a fourth electrode 28 is disposed on the electron transport layer 27 as a cathode. Herein, the fourth electrode 28 may also be of a single-layer structure that uses a transparent or reflective electrode (such as ITO), or of a multi-layer structure (such as ITO-Ag).

The organic light-emitting diode display device of the present embodiment made through the process described above comprises: a substrate 21; a first electrode 221, a second electrode 222 and a third electrode 223, all disposed on the substrate 21; a red organic material layer (having a red hole transport layer 251 and a red light-emitting layer 252) disposed on the first electrode 221 so that it is electrically connecting to the first electrode control area of the first electrode 221 through the corresponding vent of the pixel defining layer, a green organic material layer (having a green hole transport layer 241 and a green light-emitting layer 242) disposed on the second electrode 222 so that it is electrically connecting to the second electrode control area of the second electrode 222 through the corresponding vent of the pixel defining layer; a blue organic material layer 26, disposed on the third electrode 223, the red organic material layer (having a red hole transport layer 251 and a red light-emitting layer 252) and the green organic material layer (having a green hole transport layer 241 and a green light-emitting layer 242) so that it is electrically connecting to the third electrode control area of the third electrode 223 through the corresponding vent of the pixel defining layer; and a fourth electrode 28 disposed on the blue organic material layer 26. Therein, the first electrode 221 is corresponding to a red sub-pixel (R sub-pixel), the second electrode 222 is corresponding to a green sub-pixel (G sub-pixel), and the third electrode 223 is corresponding to a blue sub-pixel (B sub-pixel). The sub-pixels of the three colors jointly compose a pixel unit. In other embodiments, a pixel unit may be composed of sub-pixels of a different combination in terms of number and color. For example, it may be a combination of a red sub-pixel, a green sub-pixel, a blue sub-pixel and a white sub-pixel (RGBW), or a combination of a red sub-pixel, a green sub-pixel and two blue sub-pixels (RBGB), or a combination of a red sub-pixel, two green sub-pixels and a blue sub-pixel (RGBG), without limitation.

As described previously, in the process of forming the organic light-emitting diode display panel of FIG. 2, only the formation of the red organic material layer (having the red hole transport layer 251 and the red light-emitting layer 252) and the green organic material layer (having the green hole transport layer 241 and the green light-emitting layer 242) requires the use of the fine metal mask 11 having the openings 12 of FIG. 1, and the formation of the blue organic material layer 26 may be achieved using the same open mask for the formation of the hole transport/injection layer 23 and the electron transport layer 27, without using a fine metal mask 11 having the openings as shown in FIG. 1. Thus, the present disclosure saves one fine metal mask that is otherwise required for forming the blue organic material layer 26 in the conventional approach, thereby reducing the overall manufacturing costs.

Particularly, with the trend toward display panels have increasingly high PPI resolution, the precision of a fine metal mask in terms of opening and positioning is more important than ever, and this makes a fine metal mask tens or even hundreds of times as expensive as an open mask in terms of manufacturing cost. The present disclosure thus significantly reduces the manufacturing costs for a display device by allowing the blue organic material layer to be formed without using a dedicated fine metal mask.

Figure 3:
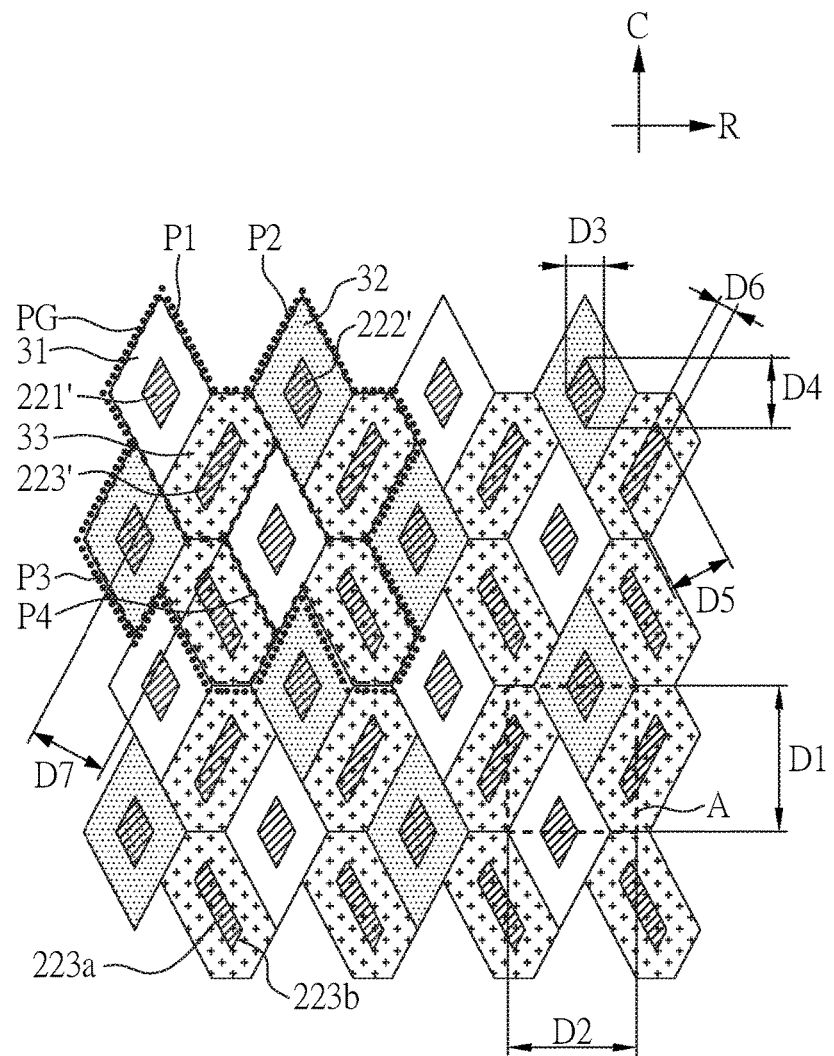
FIG. 3 schematically depicts pixel arrangement in an organic light-emitting diode display device of one embodiment of the present disclosure.

FIG. 3 schematically depicts pixel arrangement in an organic light-emitting diode display device of one embodiment of the present disclosure. Therein, the organic light-emitting diode display device of the present embodiment has its display area composed of plural pixel groups PG. Each of the pixel groups PG comprises: a first pixel P1 comprising a red sub-pixel 31 and at least one blue sub-pixel 33, wherein the blue sub-pixel 33 is located obliquely below the red sub-pixel 31; a second pixel P2 comprising a green sub-pixel 32 and at least one blue sub-pixel 33, wherein the blue sub-pixel 33 is located obliquely below the green sub-pixel 32; a third pixel P3 comprising a green sub-pixel 32 and at least one blue sub-pixel 33, wherein the blue sub-pixel 33 is located obliquely below the green sub-pixel 32; and a fourth pixel P4 comprising a red sub-pixel 31 and at least one blue sub-pixel 33, wherein the blue sub-pixel 33 is located obliquely below the red sub-pixel 31. In the present embodiment, the first pixel P1, the second pixel P2, the third pixel P3 and the fourth pixel P4 each comprise a blue sub-pixel 33. In other embodiment, the first pixel P1, the second pixel P2, the third pixel P3 and the fourth pixel P4 may each comprise plural blue sub-pixels 33. Therein, the first pixel P1 and the second pixel P2 are arranged adjacent to each other in a row direction R. The first pixel P1 and the third pixel P3 are arranged adjacent to each other in a column direction C. The fourth pixel P4 is diagonal to the first pixel P1. The fourth pixel P4 is adjacent to the second pixel P2 and the third pixel P3. In addition, the first pixel P1, the second pixel P2, the third pixel P3 and the fourth pixel P4 compose the pixel group PG. Plural such pixel groups PG may be arranged in a column direction C and in a row direction R as an array to compose a display area. Herein, the phrase "column direction C" refers to the vertical direction of the pixel arrangement as shown in FIG. 3; the phrase "row direction R" refers to the transverse direction of the pixel arrangement as shown in FIG. 3; the phrase "the blue sub-pixel 33 is located obliquely below the red sub-pixel 31/green sub-pixel 32" refers to that the blue sub-pixel 33 is located besides the lower part of the red sub-pixel 31/green sub-pixel 32 and arranged in an oblique direction between the column direction and the row direction. The column direction C and the row direction R maybe perpendicular to each other, or jointly include an angle not equal to 90 degrees. In a single pixel group PG, the blue sub-pixels 33 are quantitatively more than or equal to the sum of the red sub-pixels 31 and the green sub-pixels 32. The blue sub-pixel 33 may be quantitatively twice or more as many as the red sub-pixels 31, and the blue sub-pixel 33 may be quantitatively twice or more as many as the green sub-pixels 32. The organic light-emitting diode display panel of the organic light-emitting diode display device further has a peripheral area that is located at display area and surrounds the display area. The peripheral area may have a few red sub-pixels, green sub-pixels or blue sub-pixels disposed on the edge adjacent to the display area. These sub-pixels are not for display but acting as dummy sub-pixels for side match. The dummy blue sub-pixels in the peripheral area are quantitatively more than or equal to the sum of the dummy red sub-pixels and the dummy green sub-pixels.

In this embodiment, in the same row direction R, the red sub-pixel 31 and the blue sub-pixel 33 of the first pixel P1 and the green sub-pixel 32 and the blue sub-pixel 33 of the adjacent second pixel P2 are electrically connecting to the same scan line through their respective corresponding thin film transistors. The red sub-pixel 31 of the first pixel P1 and the green sub-pixel 32 of the second pixel P2 are located at one same side of the scan line, while the blue sub-pixel 33 of the first pixel P1 and the blue sub-pixel 33 of the second pixel P2 are located at the opposite side of the scan line. In other embodiment, the red sub-pixel 31 of the first pixel P1 and the green sub-pixel 32 of the adjacent second pixel P2 are electrically connecting to a scan line through their respective corresponding thin film transistors. The red sub-pixel 31 of the first pixel P1 and the green sub-pixel 32 of the second pixel P2 may be located at the same side or located at two opposite sides of the scan line. The blue sub-pixel 33 of the first pixel P1 and the blue sub-pixel 33 of the adjacent second pixel P2 are electrically connecting to another scan line through their respective corresponding thin film transistors. The blue sub-pixel 33 of the first pixel P1 and the blue sub-pixel 33 of the adjacent second pixel P2 may be located at the same side or at the opposite sides of the other scan line. In other embodiment, the red sub-pixel 31 and the and blue sub-pixel 33 of the first pixel P1 and the green sub-pixel 32 and the blue sub-pixel 33 of the adjacent second pixel P2 are electrically connecting to different scan lines through their respective corresponding thin film transistors. These scan lines both extend in the row direction R.

In this embodiment, in the same column direction C, the red sub-pixel 31 of the first pixel P1 and the green sub-pixel 32 of the adjacent third pixel P3 are electrically connecting to the same data line through their respective corresponding thin film transistors. The red sub-pixel 31 of the first pixel P1 and the green sub-pixel 32 of the third pixel P3 may be located at the same side or at two opposite sides of the data line, while the blue sub-pixel 33 of the first pixel P1 and the blue sub-pixel 33 of the adjacent third pixel P3 are electrically connecting to another data line through their respective corresponding thin film transistors. The blue sub-pixel 33 of the first pixel P1 and the blue sub-pixel 33 of the third pixel P3 may be located at the same side or at two opposite sides the other data line. In other embodiment, the red sub-pixel 31 and the blue sub-pixel 33 of the first pixel P1 are electrically connecting to another data line through their respective corresponding thin film transistors. The red sub-pixel 31 and the blue sub-pixel 33 of the first pixel P1 may be located at the same side or at two opposite sides of the data line, while the green sub-pixel 32 and the blue sub-pixel 33 of the adjacent third pixel P3 are electrically connecting to another data line through their respective corresponding thin film transistors. The green sub-pixel 32 and the blue sub-pixel 33 of the second pixel P2 may be located at the same side or at two opposite sides of the other data line. In other embodiment, the red sub-pixel 31 and the and blue sub-pixel 33 of the first pixel P1 and the green sub-pixel 32 and the and blue sub-pixel 33 of the adjacent second pixel P2 are electrically connecting to different data lines through their respective corresponding thin film transistors. These data lines extend in the column direction C.

Therein, the first electrode control area 221' corresponding to the red sub-pixel 31 (i.e. the bottom of the first vent in the flat layer) and the second electrode control area 222' corresponding to the green sub-pixel 32 (i.e. the bottom of the second vent in the flat layer) are each substantially a rhombus, while a third electrode control area 223' corresponding to the blue sub-pixel 33 (i.e. the bottom of the third vent in the flat layer) is substantially a parallelogram. The terms rhombus, parallelogram, or other geometric shapes such as circle, trapezoid, rectangle, square represent a rough description of an outline and may include some slight edge deformation and fillets at apexes. Particularly, the third electrode control area 223' corresponding to the blue sub-pixel 33 has a long side 223a and a short side 223b. In the present embodiment, the long side 223a of the third electrode control area 223' is adjacent to the red sub-pixel 31, and the short side 223b is adjacent to the green sub-pixel 32. In other embodiment, the long side 223a of the third electrode control area 223' is adjacent to the green sub-pixel 32, and the short side 223b is adjacent to the red sub-pixel 31. The first electrode control area 221' corresponding to the red sub-pixel 31 and the second electrode control area 222' corresponding to the green sub-pixel 32 each comprise a rhombus having a major axis and a minor axis. In the present embodiment, the major axes extend in the column direction C and the minor axes extend in the row direction R. In other embodiment, major axes extend in the row direction R and the minor axes extend in the column direction C.

In addition, in the present embodiment, in one pixel group PG, the red sub-pixel 31 of the first pixel P1 and the green sub-pixel 32 of the third pixel P3 are offset in the column direction C and compose a zigzag pattern. In other words, when viewed in the column direction C the center of the first electrode control area 221' of the red sub-pixel 31 of the first pixel P1 is not aligned with but offset from the center of the second electrode control area 222' of the green sub-pixel 32 of the third pixel P3. The blue sub-pixels 33 of the first pixel P1 and of the third pixel P3 also compose a zigzag pattern in the column direction C. In other words, when viewed in the column direction C the major axis of the third electrode control area 223' of the blue sub-pixel 32 of the first pixel P1 and the major axis of the third electrode control area 223' of the blue sub-pixel 32 of the third pixel P3 extend in different directions and include an angle therebetween, making the blue sub-pixel 32 compose a zigzag pattern in the column direction C. Particularly, in the column direction C, the blue sub-pixel 33 of the first pixel P1 and the blue sub-pixel 33 of the third pixel P3 are adjacent to each other.

Figure 4:
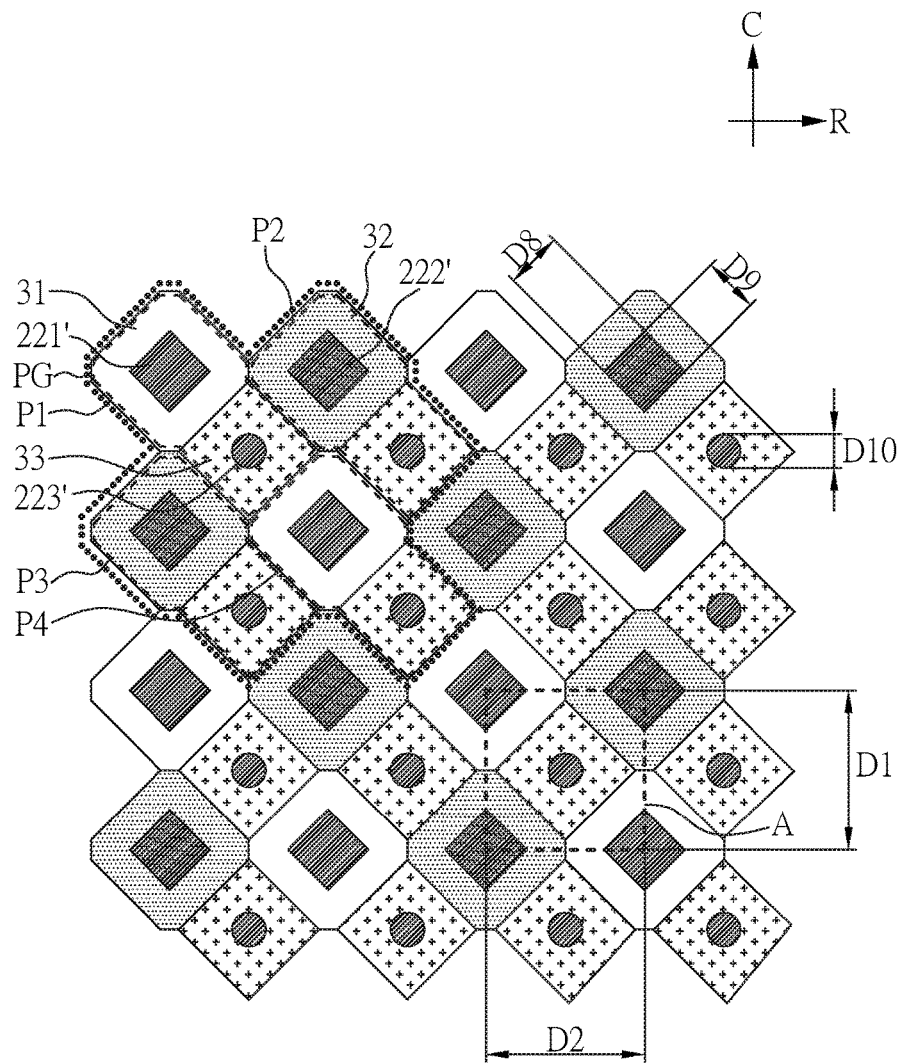
FIG. 4 schematically depicts pixel arrangement in an organic light-emitting diode display device of another embodiment of the present disclosure.

FIG. 4 schematically depicts pixel arrangement in an organic light-emitting diode display device of another embodiment of the present disclosure. In the present embodiment, the display device is made in the same way as described above and will not be explained in detail. The display device of the present embodiment has a pixel arrangement similar to that of the display device of FIG. 3, with the difference laid in the size of the red, green and blue sub-pixels 31, 32, 33 and the pattern design of the corresponding electrodes.

As shown in FIG. 4, in the display device of the present embodiment, the first electrode control area 221' corresponding to the red sub-pixel 31 and the second electrode control area 222' corresponding to the green sub-pixel 32 are rectangles, while the third electrode control area 223' corresponding to the blue sub-pixel 33 is a circle.

As shown in FIG. 3 and FIG. 4, the organic light-emitting diode display device of the present embodiment has a novel sub-pixel arrangement that contributes to high-resolution display. In addition, in the organic light-emitting diode display device of the present embodiment, in one pixel group PG, since the first pixel P1, the second pixel P2, the third pixel P3 and the fourth pixel P4 each have a blue sub-pixel 33, the percentage of the blue sub-pixels 33 in the display device is increased. In an embodiment, the total light-emitting area of the blue sub-pixels 33 may be equal to or greater than the total light-emitting area of the red sub-pixels 31. And the total light-emitting area of the blue sub-pixel 33 may be equal to or greater than the total light-emitting area of the green sub-pixel 32. In an embodiment, the total light-emitting area of the blue sub-pixels 33 is greater than the total light-emitting area of the red sub-pixels 31 and the green sub-pixels 32, as shown in FIG. 3. This effectively improves the luminous efficiency of blue organic light-emitting material. The light-emitting area is defined by the size of the electrode control area, because the substantially controllable electrode in the light-emitting layer is the electrode control area exposed at the bottom of the vent in the pixel defining layer.

As an example, a display device with a pixel size of 48×48 µm² may be made using the pixel arrangements shown in FIG. 3 and FIG. 4 with the following parameters. An area of a pixel is represented by the area A in FIG. 3 and FIG. 4. In FIG. 3, as to the adjacent red sub-pixel 31 and green sub-pixel 32, the area A is a rectangle defined by a diagonal connecting the leftmost point of the red sub-pixel 31 in the row direction R and the rightmost point of the green sub-pixel 32 in the row direction R. In FIG. 4, the area A has its four apexes at the centers of adjacent first electrode control areas 221' of the red sub-pixels 31 and of second electrode control areas 222' of the green sub-pixels 32. Therein, the area A has length D1 in the column direction C and length D2 in the row direction R. And the length D1 and the length D2 are both 48 µm.

In the embodiment of FIG. 3, the first electrode control area 221' corresponding to the red sub-pixel 31 and the second electrode control area 222' corresponding to the green sub-pixel 32 are both rhombuses and are substantially dimensionally identical. Thus, only the second electrode control area 222' is described herein for simplicity. The second electrode control area 222' corresponding to the green sub-pixel 32 has a diagonal length D3 (the minor axis) of 12.5 µm and another diagonal length D4 (the major axis) of 23 µm. The third electrode control area 223' corresponding to the blue sub-pixel 33 is a parallelogram with a long side 223a having a length D5 of 26 µm and a short side 223b having a length D6 of 6 µm.

Additionally, as shown in FIG. 1 and FIG. 3, the blocking zone 13 located between two openings 12 of the metal mask 11 for making the red sub-pixel 31 is corresponding to the blue sub-pixel 33 and its third electrode control area 223'. Where the blocking zone 13 has its minimal width D7 too small, the blocking zone 13 tends to break and lead to failure of the metal mask 11. Taking account of the tolerance of evaporation and the minimal width D7 of the metal mask 11, when the tolerance of evaporation is 10 µm, the minimal width D7 of the metal mask 11 is 26 µm (the length D6+2×10 µm). Since the green sub-pixel 32 uses the fine metal mask similar to that for the red sub-pixel 31, no repeated description is given herein.

In a different embodiment shown in FIG. 4, the first electrode control area 221' corresponding to the red sub-pixel 31 and the second electrode control area 222' corresponding to the green sub-pixel 32 are both rectangles and are substantially dimensionally identical, so only the second electrode control area 222' is explained herein. The second electrode control area 222' corresponding to the green sub-pixel 32 is roughly a rectangle with two sides having length D8 and length D9 of 15 µm. The third electrode control area 223' corresponding to the blue sub-pixel 33 is roughly a circle having a diameter D10 of 12 µm. Similarly, with the consideration of the tolerance of evaporation and the minimal width of the blocking zone of the metal mask, when the tolerance of evaporation is 10 µm, the minimal width of the blocking zone of the metal mask is 32 µm (the diameter D10+2×10 µm).

The results of calculation of light-emitting areas in the display devices of FIG. 3 and FIG. 4 are shown in Table 1 below.

TABLE 1

Figure 5:
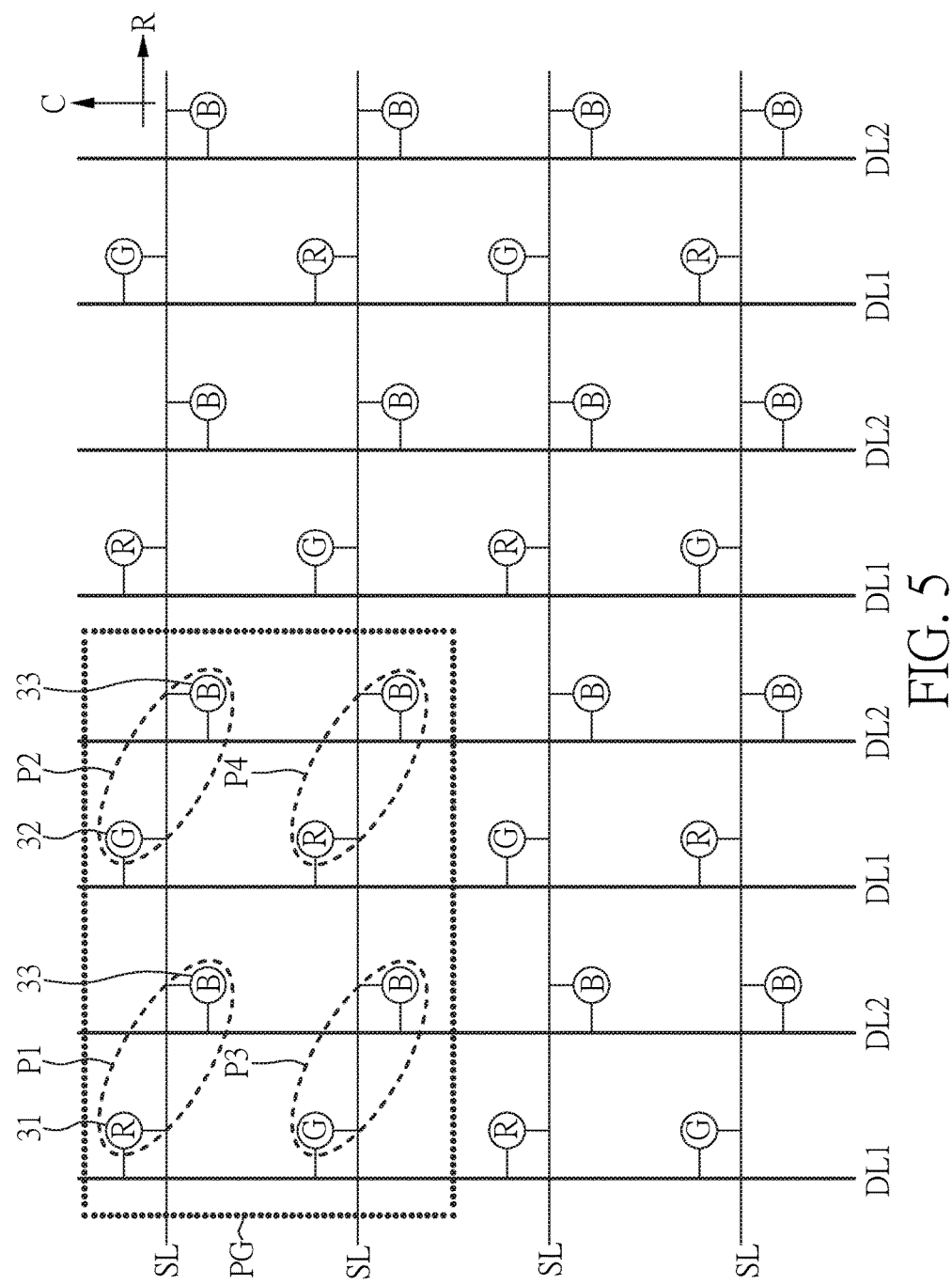
FIG. 5 schematically depicts connection among scan lines, data lines and sub-pixel electrodes in an organic light-emitting diode display device of one embodiment of the present disclosure.

| | Light-Emitting Area | | | |
| | Red Sub-Pixel | Green Sub-Pixel | Blue Sub-Pixel | Average |
|---|---|---|---|---|
| FIG. 5 | 14.65% | 14.65% | 14.72% | 14.7% |
| FIG. 3 | 9.36% | 9.36% | 20.31% | 13.0% |

As shown in Table 1, with the pixel arrangement of FIG. 3, a total light-emitting area of the blue sub-pixels 33 is greater than a total light-emitting area of the red sub-pixels 31 and the green sub-pixels 32. This improves the inferior luminous efficiency of a blue organic light-emitting material.

The dimensions of the metal mask 11, the first electrode control area 221', the second electrode control area 222' and the third electrode control area 223' are recited herein as examples, and the present disclosure is not limited thereto. The dimensions of the metal mask 11, the first electrode control area 221', the second electrode control area 222' and the third electrode control area 223' may be adjusted and changes according to the pixel size and product requirements.

FIG. 5 schematically depicts connection among scan lines, data lines and sub-pixel electrodes in an organic light-emitting diode display device of one embodiment of the present disclosure. Such connection is applicable to a display device having the pixel arrangement as shown in FIG. 3 or FIG. 4. As shown in FIG. 5, the display device of the present embodiment further comprises a scan line SL, a first data line DL1 and a second data line DL2. Therein, the scan line SL intersects with the first data line DL1 and the second data line DL2. The scan line SL extends in the row direction R, while the first data line DL1 and the second data line DL2 extend in the column direction C. Therein, the scan line SL electrically connecting to the red sub-pixel 31 and the blue sub-pixel 33 of the first pixel P1 and the green sub-pixel 32 and the and blue sub-pixel 33 of the second pixel P2 through their respective thin film transistors. The red sub-pixel 31 and the green sub-pixel 32 are located at one side of the scan line SL, while both of the blue sub-pixels 33 are located at the other side of the scan line SL. The first data line DL1 is electrically connecting to the red sub-pixel 31 of the first pixel P1 and the green sub-pixel 32 of the third pixel P3 through their respective thin film transistors. The red sub-pixel 31 and the green sub-pixel 32 are both located at the same side of the first data line DL1. The second data line DL2 is electrically connecting to the blue sub-pixels 33 of the first pixel P1 and of the third pixel P3 through their respective thin film transistors. The blue sub-pixels 33 are both located at the same side of the second data line DL2.

In the drawing, the scan line SL, the first data line DL1 and the second data line DL2 are depicted roughly to represent electric connection and signal transmission among the sub-pixels schematically, but not the actual appearances of the scan line SL, the first data line DL1 and the second data line DL2. The actual appearances of the scan line SL, the first data line DL1 and the second data line DL2 may be designed and modified according to the design of the display device.

Figure 6:
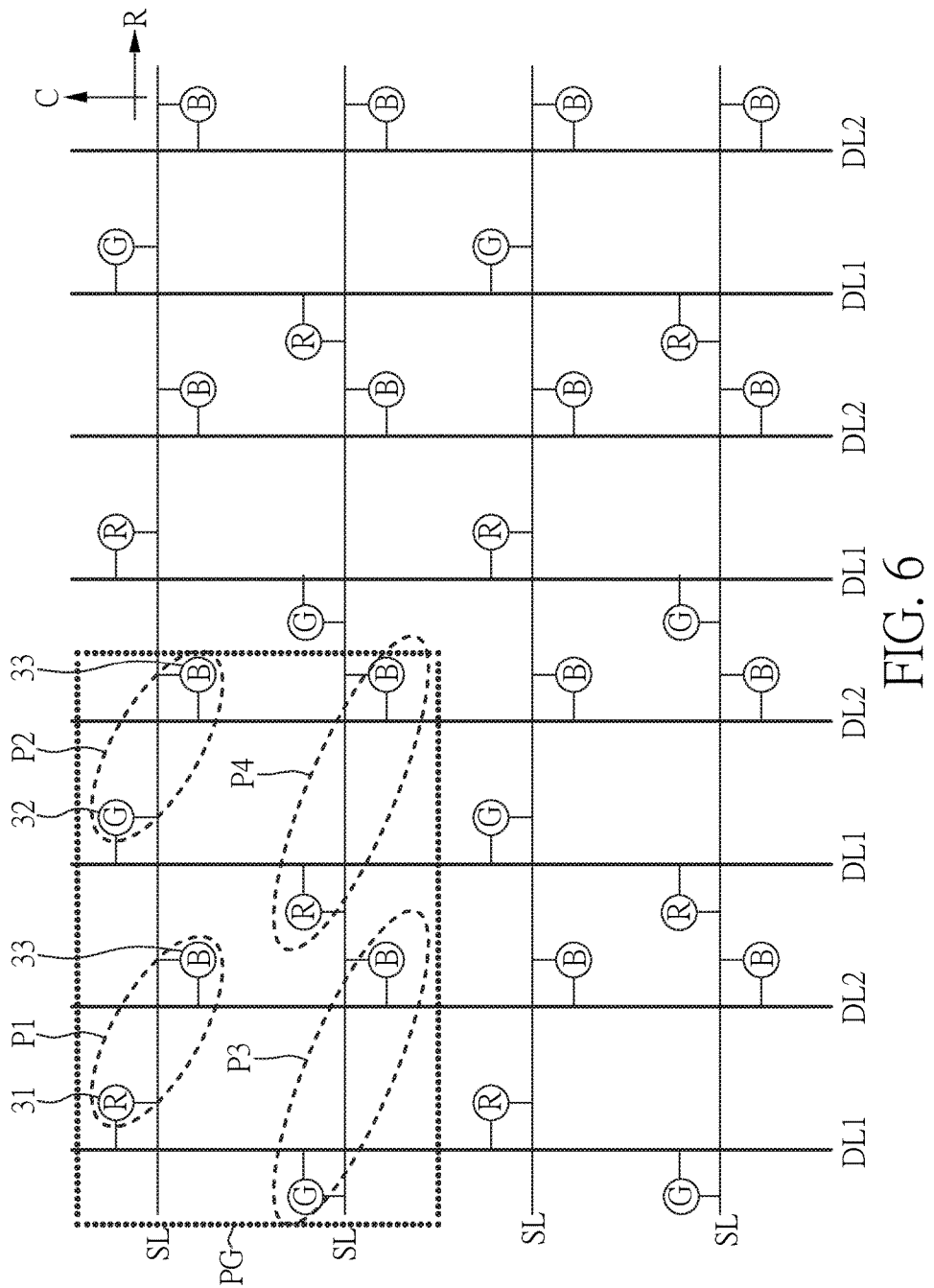
FIG. 6 schematically depicts connection among scan lines, data lines and sub-pixel electrodes in an organic light-emitting diode display device of another embodiment of the present disclosure.

FIG. 6 schematically depicts connection among scan lines, data lines and sub-pixel electrodes in an organic light-emitting diode display device of another embodiment of the present disclosure. Such connection is applicable to a display device having the pixel arrangement as shown in FIG. 3 or FIG. 4. As shown in FIG. 6, the disclosed display device further comprises a scan line SL, a first data line DL1 and a second data line DL2. Therein, the scan line SL intersects the first data line DL1 and the second data line DL2 through their respective thin film transistors. The scan line SL extends in the row direction R, while the first data line DL1 and the second data line DL2 extend in the column direction C. Therein, the scan line SL is electrically connecting to the red sub-pixel 31 and the blue sub-pixel 33 of the first pixel P1 and the green sub-pixel 32 and the blue sub-pixel 33 of the second pixel P2. The red sub-pixel 31 and the green sub-pixel 32 are located at one side of the scan line SL, while both of the blue sub-pixels 33 are located at the other side of the scan line SL. The first data line DL1 is electrically connecting to the red sub-pixel 31 of the first pixel P1 and the green sub-pixel 32 of the third pixel P3 through their respective thin film transistors. The red sub-pixel 31 is located at one side of the first data line DL1, and the green sub-pixel 32 is located at the opposite side of the first data line DL1. The second data line DL2 is electrically connecting to the blue sub-pixels 33 of the first pixel P1 and of the third pixel P3 through their respective thin film transistors. Both of the blue sub-pixels 33 are located at the same side of the second data line DL2.

In addition, a display device made as described in any of the embodiments of the present disclosure as described previously may be integrated with a touch panel to compose a touch display device. Moreover, a display device or touch display device made as described in any of the embodiments of the present disclosure as described previously may be applied to any electronic devices known in the art that need a display screen, such as displays, mobile phones, laptops, video cameras, still cameras, music players, mobile navigators, TV sets, and other electronic devices that display images.

While the improved embodiments are provided for illustrating the concept of the present disclosure, it is to be understood that these embodiments in no way limit the scope of the present disclosure which is defined solely by the appended claims.

What is claimed is:

1. A display device, comprising:
   a scan line, extending along a row direction;
   a first data line, extending along a column direction;
   a second data line, extending along the column direction; and
   a pixel group, comprising a first sub-pixel, a second sub-pixel, a third sub-pixel, a fourth sub-pixel, a fifth sub-pixel, a sixth sub-pixel and a seventh sub-pixel,
   wherein the first sub-pixel and the second sub-pixel have the same color, the third sup-pixel and the fourth sub-pixel have the same color, and the fifth sub-pixel, the sixth sub-pixel and the seventh sub-pixel have the same color,
   wherein the first sub-pixel is diagonal to the second sub-pixel, the fifth sub-pixel is between the first sub-pixel and the second sub-pixel, the third sub-pixel is diagonal to the fourth sub-pixel, and the fifth sub-pixel is between the third sub-pixel and the fourth sub-pixel,
   wherein the scan line is electrically connected to one of thin film transistors of the first sub-pixel, one of thin film transistors of the fifth sub-pixel, one of thin film transistors of the third sub-pixel and one of thin film transistors of the sixth sub-pixel,
   wherein the first data line is electrically connected to the one of the thin film transistors of the first sub-pixel and one of thin film transistors of the fourth sub-pixel, and the second data line is electrically connected to the one of the thin film transistors of the fifth sub-pixel and one of thin film transistors of the seventh sub-pixel.

2. The display device of claim 1, wherein the sixth sub-pixel is diagonal to the seventh sub-pixel, and the second sub-pixel is between the sixth sub-pixel and the seventh sub-pixel.

3. The display device of claim 1, wherein the first sub-pixel and the second sub-pixel have red color, the third sub-pixel and the fourth sub-pixel have green color, and the fifth sub-pixel, the sixth sub-pixel and the seventh sub-pixel have blue color.

4. The display device of claim 1, wherein the first sub-pixel and the second sub-pixel have red color, the third sub-pixel and the fourth sub-pixel have blue color, and the fifth sub-pixel, the sixth sub-pixel and the seventh sub-pixel have green color.

5. The display device of claim 1, wherein a total light-emitting area of the fifth sub-pixel, the sixth sub-pixel and the seventh sub-pixel is equal to or greater than a total light-emitting area of the first sub-pixel and the second sub-pixel.

6. The display device of claim 1, wherein a total light-emitting area of the fifth sub-pixel, the sixth sub-pixel and the seventh sub-pixel is equal to or greater than a total light-emitting area of the third sub-pixel and the fourth sub-pixel.

7. The display device of claim 1, wherein the pixel group further comprises an eighth sub-pixel diagonal to the fifth sub-pixel, and the second sub-pixel is between the fifth sub-pixel and the eighth sub-pixel.

8. The display device of claim 1, wherein the fifth sub-pixel and the sixth sub-pixel are located at the same side of the scan line.

9. The display device of claim 1, wherein the first sub-pixel and the third sub-pixel are located at the same side of the scan line.

10. The display device of claim 1, further comprising a third data line extending along the column direction, wherein the third data line is electrically connected to the one of thin film transistors of the third sub-pixel and one of thin film transistors of the second sub-pixel.

11. A touch display device, comprising:
a scan line, extending along a row direction;
a first data line, extending along a column direction;
a second data line, extending along the column direction; and
a pixel group, comprising a first color-1 sub-pixel, a second color-1 sub-pixel, a first color-2 sub-pixel, a second color-2 sub-pixel, a first color-3 sub-pixel, a second color-3 sub-pixel and a third color-3 sub-pixel,
wherein the first color-1 sub-pixel is diagonal to the second color-1 sub-pixel, the first color-3 sub-pixel is between the first color-1 sub-pixel and the second color-1 sub-pixel, the first color-2 sub-pixel is diagonal to the second color-2 sub-pixel, and the first color-3 sub-pixel is between the first color-2 sub-pixel and the second color-2 sub-pixel,
wherein the scan line is electrically connected to one of thin film transistors of the first color-1 sub-pixel, one of thin film transistors of the first color-3 sub-pixel, one of thin film transistors of the first color-2 sub-pixel and one of thin film transistors of the second color-3 sub-pixel,
wherein the first data line is electrically connected to the one of the thin film transistors of the first color-1 sub-pixel and one of thin film transistors of the second color-2 sub-pixel, and the second data line is electrically connected to the one of the thin film transistors of the first color-3 sub-pixel and one of thin film transistors of the third color-3 sub-pixel.

12. The touch display device of claim 11, wherein the second color-3 sub-pixel is diagonal to the third color-3 sub-pixel, and the second color-1 sub-pixel is between the second color-3 sub-pixel and the third color-3 sub-pixel.

13. The touch display device of claim 11, wherein the first color-1 sub-pixel and the second color-1 sub-pixel have red color, the first color-2 sub-pixel and the second color-2 sub-pixel have green color, and the first color-3 sub-pixel, the second color-3 sub-pixel and the third color-3 sub-pixel have blue color.

14. The touch display device of claim 11, wherein the first color-1 sub-pixel and the second color-1 sub-pixel have red color, the first color-2 sub-pixel and the second color-2 sub-pixel have blue color, and the first color-3 sub-pixel, the second color-3 sub-pixel and the third color-3 sub-pixel have green color.

15. The touch display device of claim 11, wherein a total light-emitting area of the first color-3 sub-pixel, the second color-3 sub-pixel and the third color-3 sub-pixel is equal to or greater than a total light-emitting area of the first color-1 sub-pixel and the second color-1 sub-pixel.

16. The touch display device of claim 11, wherein a total light-emitting area of the first color-3 sub-pixel, the second color-3 sub-pixel and the third color-3 sub-pixel is equal to or greater than a total light-emitting area of the first color-2 sub-pixel and the second color-2 sub-pixel.

17. The touch display device of claim 11, wherein the pixel group further comprises a fourth color-3 sub-pixel diagonal to the first color-3 sub-pixel, and the second color-1 sub-pixel is between the first color-3 sub-pixel and the fourth color-3 sub-pixel.

18. The touch display device of claim 11, wherein the first color-3 sub-pixel and the second color-3 sub-pixel are located at the same side of the scan line.

19. The touch display device of claim 11, wherein the first color-1 sub-pixel and the first color-2 sub-pixel are located at the same side of the scan line.

20. The touch display device of claim 11, further comprising a third data line extending along the column direction, wherein the third data line is electrically connected to the one of thin film transistors of the first color-2 sub-pixel and one of thin film transistors of the second color-1 sub-pixel.

* * * * *